United States Patent [19]
Bezzam et al.

[11] Patent Number: 5,734,294
[45] Date of Patent: Mar. 31, 1998

[54] LARGE SWING WIDE BAND HIGH ORDER PROGRAMMABLE ACTIVE FILTERS

[75] Inventors: Ignatius S. A. Bezzam, Mountain View; David W. Ritter, San Jose, both of Calif.

[73] Assignee: Raytheon Company, Lexington, Mass.

[21] Appl. No.: 601,920

[22] Filed: Feb. 15, 1996

[51] Int. Cl.$^6$ .................. H03K 5/00; H03F 3/45
[52] U.S. Cl. .................. 327/552; 327/553; 327/103; 327/336; 327/563; 327/561; 330/107; 330/260; 330/252
[58] Field of Search .................. 327/576, 103, 327/552, 555, 556, 557, 558, 559, 336, 560, 561, 563, 553; 330/261, 260, 252, 258, 107, 109, 294

[56] References Cited

U.S. PATENT DOCUMENTS

| | | | |
|---|---|---|---|
| 4,571,507 | 2/1986 | Collings | 327/100 |
| 4,872,209 | 10/1989 | Blanken | 330/260 |
| 5,418,492 | 5/1995 | Wang et al. | 330/206 |

OTHER PUBLICATIONS

*Linear Application Databook*, National Semiconductor Corporation, 1986, pp. 813–819.

Primary Examiner—Timothy P. Callahan
Assistant Examiner—Dinh Le
Attorney, Agent, or Firm—Sarah L. Byrne

[57] ABSTRACT

A wide band, high-order, programmable video filter is implemented using transimpedance-based active integrators. An input voltage which may for instance represent a composite video signal is converted to a current in a linear manner using resistors and provided to a current amplifier at low impedance virtual ground nodes. The current is multiplied by a gain factor $\beta_R$ within the current amplifier and supplied to integrating capacitors connected in a feedback configuration around a high input impedance differential amplifier to establish an integrated differential voltage output. The transimpedance-based active integrators may be interconnected to realize wide-band, high-order video filters suitable for use in accordance with CCIR 601 standards. Input voltage swings are not restricted by a transistor's limited range of linear operation or voltage swing limitations of internal nodes but rather may allowed to swing as long as the bias currents sustain input current excursions. Thus, pre-filter attenuation and post-filter amplification is not required, thereby allowing CCIR 601 standard compliant video filters to be fabricated, in accordance with the present invention, as a single chip IC.

15 Claims, 9 Drawing Sheets

Key to

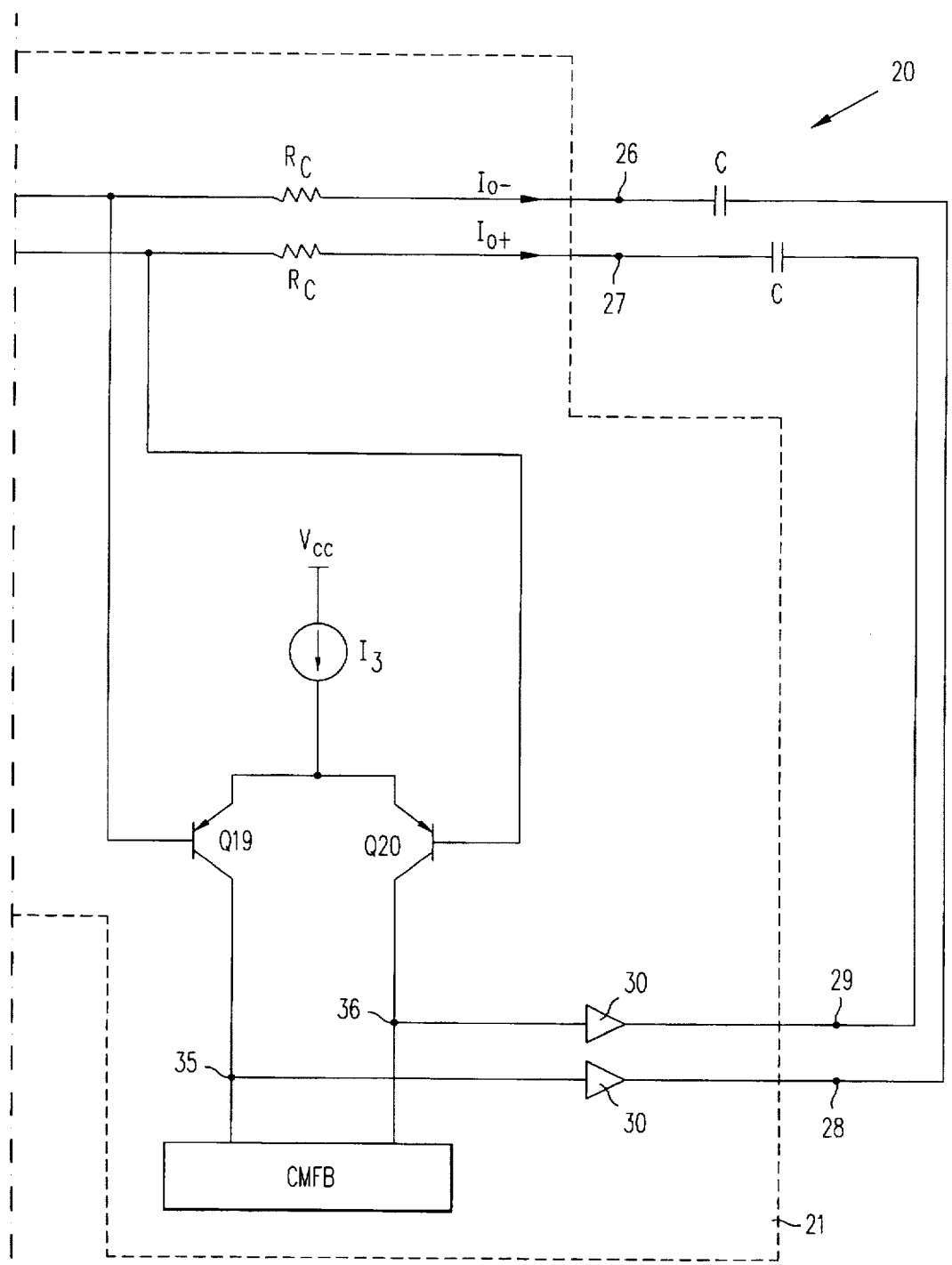
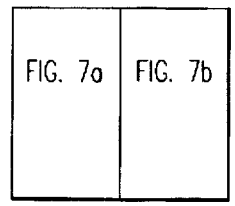
*FIG. 7b*
Key to
*FIG. 7*

1

LARGE SWING WIDE BAND HIGH ORDER PROGRAMMABLE ACTIVE FILTERS

BACKGROUND

1. Field of the Invention

The present invention relates generally to continuous time filters and specifically to fully integrated, high performance active filters.

2. Description of Related Art

Digitizing incoming composite video signals requires high-order anti-aliasing filters capable of handling large input voltage swings with minimal distortion. Compliance with CCIR 601 video standards requires such filters to have a magnitude response characterized by an equi-ripple passband gain that sharply rolls off into the stop band from approximately $\omega_c$=5.5 MHz, as illustrated by the Bode plot of FIG. 1. This magnitude response may be implemented using a 5th order elliptic filter. Since 5th order elliptic filters cause an undesirable "peaking" in the video signal's group delay, as illustrated by line 1 in FIG. 2, a 3rd order Bessel filter having a group delay indicated by line 2 of FIG. 2 is cascaded with the elliptic filter, thereby compensating for this group delay peaking caused by the elliptic filter.

The transfer function $T_1$ of a 5th order elliptic filter and the transfer function $T_2$ of a 3rd order Bessel filter may each be expressed in terms of biquadratic and integrating terms, where $$T_1 = \frac{K_1(s^2 + w_{z1}^2)}{s^2 + (w_1/Q_1)s + w_1^2} \cdot \frac{K_2(s^2 + w_{z2}^2)}{s^2 + (w_2/Q_2)s + w_2^2} \cdot \frac{w_R}{s + w_R}$$

and $$T_2 = \frac{s^2 - (w_A/Q_A)s + w_A^2}{s^2 + (w_A/Q_A)s + w_A^2} \cdot \frac{s - w_B}{s + w_B}$$

Discrete video filters which implement the 5th order elliptic transfer function $T_1$ and the 3rd order Bessel transfer function $T_2$ using passive components are well known. However, matching the discrete components therein with sufficient precision to comply with CCIR 601 video standards is very expensive and may be problematic. In addition, realizing such a high-order filter using discrete, passive components consumes an undesirably large amount of space.

The reduction of transfer functions $T_1$ and $T_2$ to products of biquadratic and integrating terms allows a video filter compliant with CCIR 601 standards to be implemented in silicon using transconductance-based active integrators. For instance, four conventional transconductors 10 and four capacitors $2C_1$, $2C_2$ may be configured as shown in FIG. 3 to implement a second order transfer function $T_S$, where $$T_3 = \frac{V_o}{V_{in}} = \frac{1}{\frac{s^2}{\omega_o^2} + \frac{s}{\omega_o Q_o} + 1}$$

and $$\omega_o = \sqrt{\frac{Gm_1 Gm_2}{C_1 C_2}} \; ; \; Q_o = \sqrt{\frac{Gm_1 C_1}{Gm_2 C_2}} \; .$$

Referring now to FIG. 4, conventional transconductor 10 converts a differential voltage to a differential current which may then be integrated via one or more capacitors, as depicted for example in FIG. 3. An input differential voltage signal $V_{i+} - V_{i-}$ is provided at the bases of transistors Q1 and Q2, respectively. Transistors Q1 and Q2 are each biased by a current source $I_s$. Diode-connected transistors Q3 and Q4 sink equal currents from the positive supply $V_{cc}$ in lines 11 and 12, respectively. The input voltage differential $V_{i+} - V_{i-}$ creates a voltage across resistor $R_E$ and thus causes a current $I_s + \Delta I$ to flow in the collector of transistor Q1 and a current $I_s - \Delta I$ to flow in the collector of transistor Q2. This current differential $\Delta I$ is scaled via transistors Q5 and Q6 to provide an output current differential $I_{o+}$, $I_{o-}$ at respective nodes 13 and 14. Transistors Q5 and Q6 are biased by a current source $2I_b$, which may be varied to adjust the gain Gm of transconductor circuit 10, where $$Gm = \frac{1}{R_E + 2r_e} \cdot \frac{I_b}{I_s} = \frac{1}{R_E} \cdot \frac{I_2}{I_s} \; .$$

The primary disadvantage of transconductor 10 results from the narrow range within which transconductor 10 converts voltage to current in a linear manner. The effective input impedance of transconductor 10 is proportional to the series resistance of resistor $R_E$ and the active resistances $r_e$ of transistors Q1 and Q2. Since $r_e$ varies with changes in input voltage, the gain Gm and thus the frequency response of transconductor 10 also changes with variations in the input signal $V_i$. This dependence of $r_e$ upon input voltage variations, coupled with the limited voltage swing of the bases of transistors Q5 and Q6, results in transconductor 10 having a maximum peak-to-peak input signal swing of approximately 100 mV for a 5 V supply. Although larger signal swings may be possible by increasing the bias current $I_s$, the resultant degradation of noise and dynamic range is unacceptable.

Since the peak-to-peak input voltage swing of a CCIR 601 compliant video filter implemented using transconductors 10 is also limited to approximately 100 mV, composite video signals must be attenuated before and then amplified after processing by such a video filter. This pre-filter attenuation and post-filter amplification degrades the differential phase and gain, and thus degrades the quality, of the composite video signal. Further, this undesirable need for pre-filter attenuation and post-filter amplification requires additional circuitry, thereby undesirably increasing circuit complexity and consuming more silicon real estate.

It may be impractical to fabricate both the video filter and the attenuation/amplification circuitry into a single chip. Accordingly, hybrid processes have typically been employed in which the passive filters and the filter amplification circuitry are fabricated as separate modules and then interconnected. Such hybrid processes are undesirable large and costly and, in addition, are not programmable.

Thus, a balancing between discrete components with a large input voltage swing and on-chip solution having limited voltage swing was necessary.

SUMMARY

A monolithic video filter compliant with CCIR 601 standards is disclosed which overcomes problems in the art discussed above. In accordance with the present invention, a wide-band, high-order, programmable video filter is implemented using transimpedance-based active integrators. An input voltage which may for instance represent a composite video signal is converted to a current in a linear manner using resistors and provided to a current amplifier at low impedance virtual ground nodes. The current is multiplied by a gain factor $\beta_R$ within the current amplifier and supplied to integrating capacitors connected in a feedback configuration around a high input impedance differential amplifier to establish an integrated differential voltage output.

The transimpedance-based active integrators may be interconnected to realize wide-band, high-order video filters suitable for use in accordance with CCIR 601 standards. Input voltage swings are not restricted by a transistor's limited range of linear operation or voltage swing limitations of internal nodes but are rather allowed to swing as long as the bias currents sustain input current excursions. Thus, pre-filter attenuation and post-filter amplification is not required, thereby allowing CCIR 601 standard compliant video filters to be fabricated, in accordance with the present invention, as a single chip IC.

DETAILED DESCRIPTION

In the discussion that follows, components common to the various embodiments of the present invention will be similarly labelled.

Figure 5:
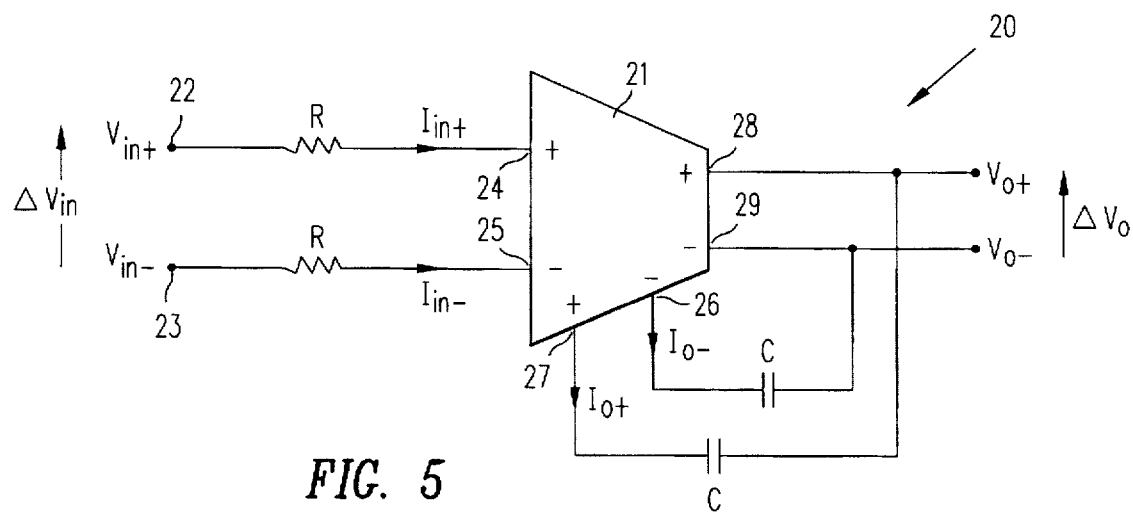
FIG. 5 is a block diagram of an integrator circuit in accordance with the present invention.

FIG. 5 shows a transimpedance-based active integrator 20 including a transimpedance amplifier 21 in accordance with the present invention. An input differential voltage signal $\Delta V_{in} = V_{in+} - V_{in-}$ is provided across input nodes 22 and 23 and converted to a differential current $\Delta I$ via resistors R, where $\Delta I = I_{in+} - I_{in-} = \Delta V_{in}/R$. This differential current $\Delta I$ is input to amplifier 21 at low impedance, virtual ground nodes 24 and 25. Input current $\Delta I_{in}$ is scaled by a gain factor $\beta_R$ via amplifier 21 to produce an output differential current $\Delta I_o = I_{o+} - I_{o-}$ at output current nodes 27 and 26. The currents $I_{o+}$ and $I_{o-}$ flowing out of amplifier 21 at respective nodes 27 and 26 are integrated via integrating feedback capacitors C to produce an output differential voltage $\Delta V_o = V_{o+} - V_{o-}$ across output voltage nodes 28 and 29 of amplifier 21.

Amplifier 21 achieves a low output impedance $R_{out}$ as seen looking into nodes 28 and 29. In the preferred embodiments, $R_{out}$ is approximately 5Ω. Thus, inherent parasitics of integrating capacitors C may be advantageously contained at output nodes 28 and 29 and will thus not degrade the performance of circuit 20 at high frequencies. This low output impedance $R_{out}$ also allows amplifier 21 to drive an output load at nodes 28 and 29 without requiring a buffer circuit.

The differential output voltage $\Delta V_o$ across nodes 28 and 29 and the voltage gain $\Delta V_o/\Delta V_i$ are given by $$\Delta V_o = \frac{\Delta I_o}{sC}$$

$$\frac{\Delta V_o}{\Delta V_{in}} = \frac{\beta_R}{sRC}$$

The filter frequency $\omega_o$ and the maximum input current $I_{in,max}$ of amplifier 20 are equal to $\beta_R/RC$ and $\Delta V_{in,max}/R$, respectively.

Figure 6A:
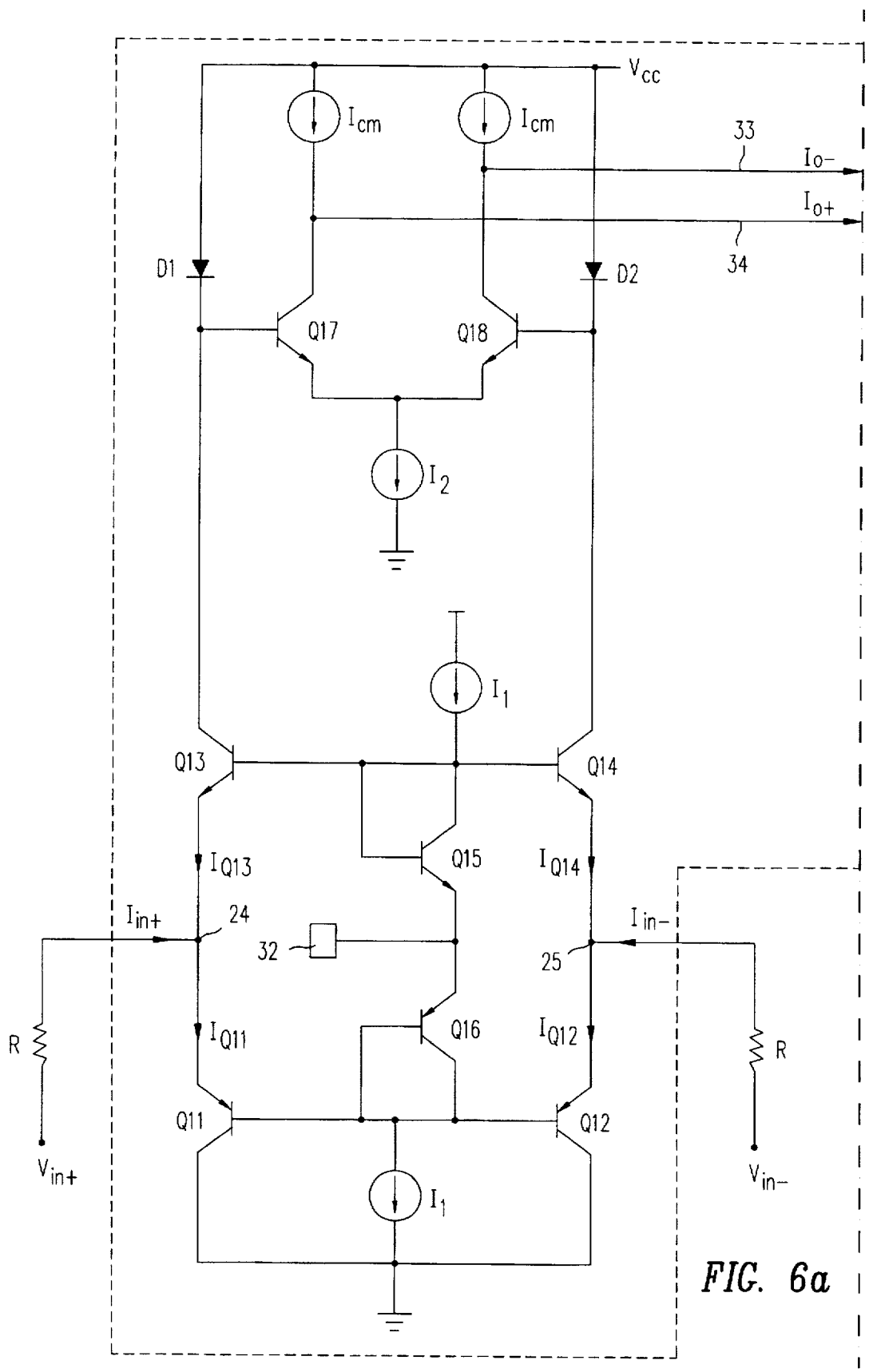
FIG. 6 is a schematic diagram of one embodiment of the integrator circuit of FIG. 5.
Figure 6B:
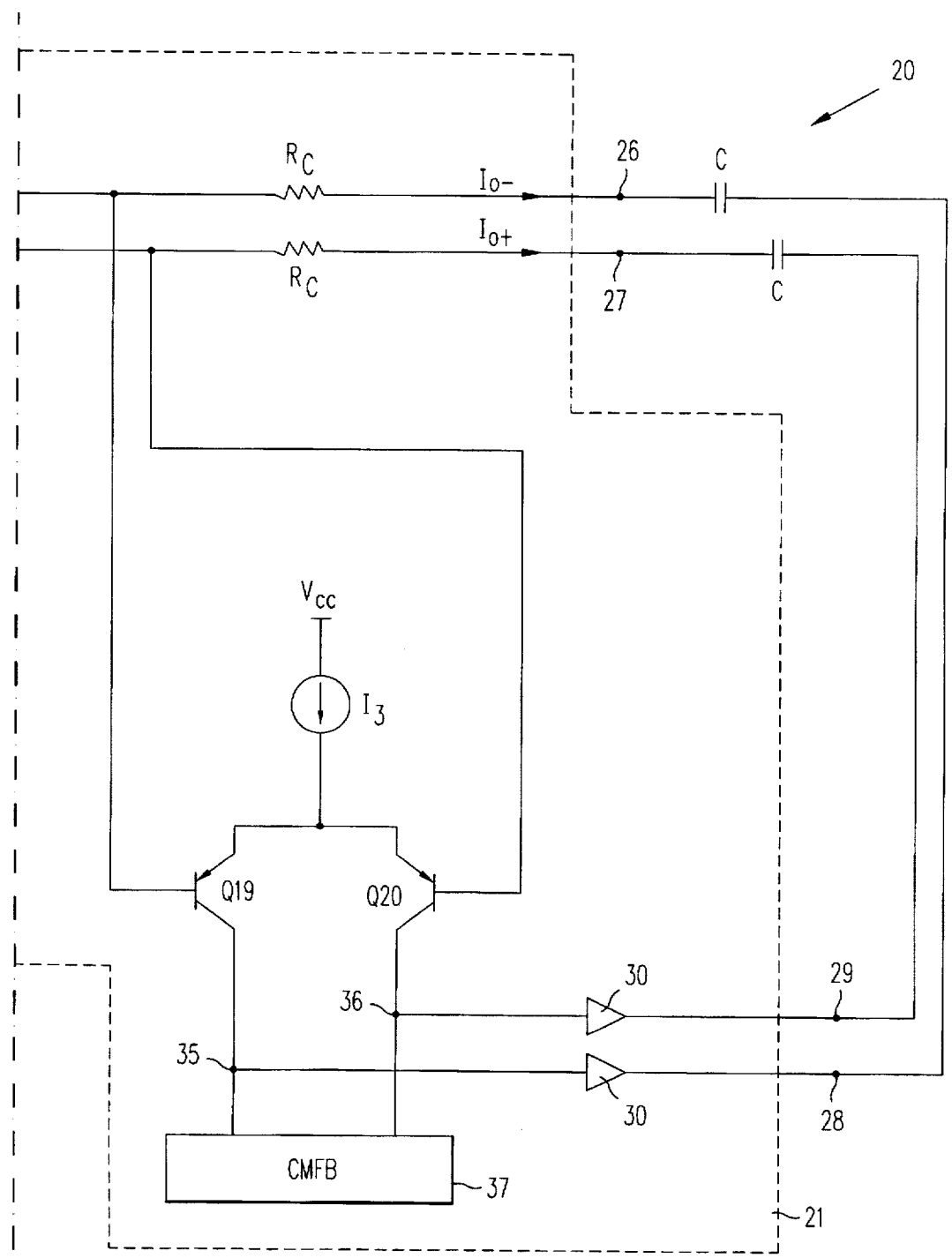
Figure 6:
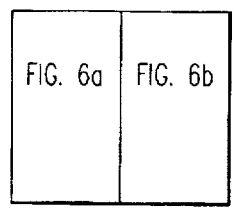

Referring also to FIG. 6, input current $I_{in+}$ affects the current $I_{Q11}$ flowing through PNP transistor Q11 and the current $I_{Q13}$ flowing through NPN transistor Q13, while input current $I_{in-}$ affects the current $I_{Q12}$ flowing through PNP transistor Q12 and the current $I_{Q14}$ flowing through NPN transistor Q14. Diode-connected NPN transistor Q15, diode-connected PNP transistor Q16, and current sources $I_1$ provide a bias circuit for amplifier 21, where $$I_{Q11} = I_1 + \frac{I_{in+}}{2}$$

$$I_{Q12} = I_1 - \frac{I_{in+}}{2}$$

$$I_{Q13} = I_1 + \frac{I_{in-}}{2}$$

$$I_{Q14} = I_1 - \frac{I_{in-}}{2}$$

The emitters of transistors Q15 and Q16 are connected to a common mode terminal 32 which is preferably tied to a voltage intermediate the positive and negative supplies (depicted in FIG. 6 as $V_{cc}$ and ground, respectively). In this manner, the bias circuit sets the voltages and currents of input transistors Q11, Q12, Q13, and Q14. Note that in biasing the input stage, nodes 24 and 25 operate as fixed-voltage nodes. Further, assuming that transistors Q13 and Q15 are of equal size, the voltage at nodes 24 and 25 equal the voltage at node 32.

NPN transistors Q17 and Q18 are biased by a current source $I_2$ and act as a differential current amplifier to create a differential output current $I_{o-}$, $I_{o+}$ at the respective collectors thereof, where $$I_{o+} - I_{o-} = \frac{I_2}{2I_1}(I_{in+} - I_{in-})$$

Thus, the current gain $\beta_R$ of circuit 21 is given as $$\beta_R = \frac{I_2}{2I_1}.$$

PNP transistors Q19 and Q20 form a high-input impedance differential amplifier which forces output currents $I_{o+}$ and $I_{o-}$ in respective lines 33 and 34 to flow into integrating capacitors C. The respective collectors 35 and 36 of transistors Q19 and Q20 are coupled to a common-mode feedback network circuit 37 which sets the common-mode voltage of high-impedance nodes 35 and 36 to a constant value approximately equal to the common-mode voltage of input nodes 24 and 25. Common-mode feedback circuits 37 are well known and thus will not be discussed in detail herein.

Integrator 20 may be programmed to meet specific performance requirements as follows. The frequency response of integrator 20 depends upon gain factor $\beta_R$ and thus may be adjusted by manipulating current $I_2$. Resistors $R_c$ connected in series with integrating capacitors C in the output current path implement excess phase shift correction over approximately a decade of frequency, thereby allowing integrator 20 to have a tunable frequency range of approximately a decade.

Integrator 20 is capable of handling much wider input voltage swings than are conventional integrators. For instance, in the preferred embodiments diodes D1 and D2 are diode-connected transistors precisely scaled to match the dimensions of transistors Q17 and Q18, respectively. In this manner, the non-linear effects of transistors Q17 and Q18 during current amplification are balanced and thus effectively canceled by diodes D1 and D2. Further, since the relationship between voltage and current in a resistor is always linear, the conversion of voltage to current in amplifier 21 (via resistors R) is, unlike conventional integrator 10, not restricted to the linear operating range of a transistor. Note also that since a current flowing into input node 24 sees a parallel combination of the active resistances $r_e$ of respective transistors Q11 and Q13, any non-linear characteristics caused by $r_{e(Q11)}$ are effectively canceled by the parallel operation of $r_{e(Q13)}$, and vice versa. As a result, amplifier 21 is able to realize a superior linear range of operation, where $I_{in,max}=I_1=\Delta V_{in}/R$. Accordingly, as long as the bias currents sustain input current excursions, amplifier 21 (and thus integrator 20) may handle large input voltage swings without requiring undesirably large bias currents. In contrast, conventional transconductor-based active integrators not only have limited input voltage swings but also require large bias currents to minimize distortion to acceptable levels.

The current mode operation of amplifier 21 minimizes voltage-swing limitations on internal nodes. This absence of internal voltage swings, in addition to maximizing the allowable input voltage swing, also advantageously increases the speed of integrator 20.

The input impedance $R_{in}$ of integrator 20, as seen looking into nodes 24 and 25, is given by $R_{in}=V_T/2I_1$ and, thus, remains constant over large input voltage swings and input current excursions. Consequently, large signal distortions typical of conventional transconductance integrators are not present in integrator 20, thereby allowing integrator 20 to achieve a high dynamic range.

Figure 7A:
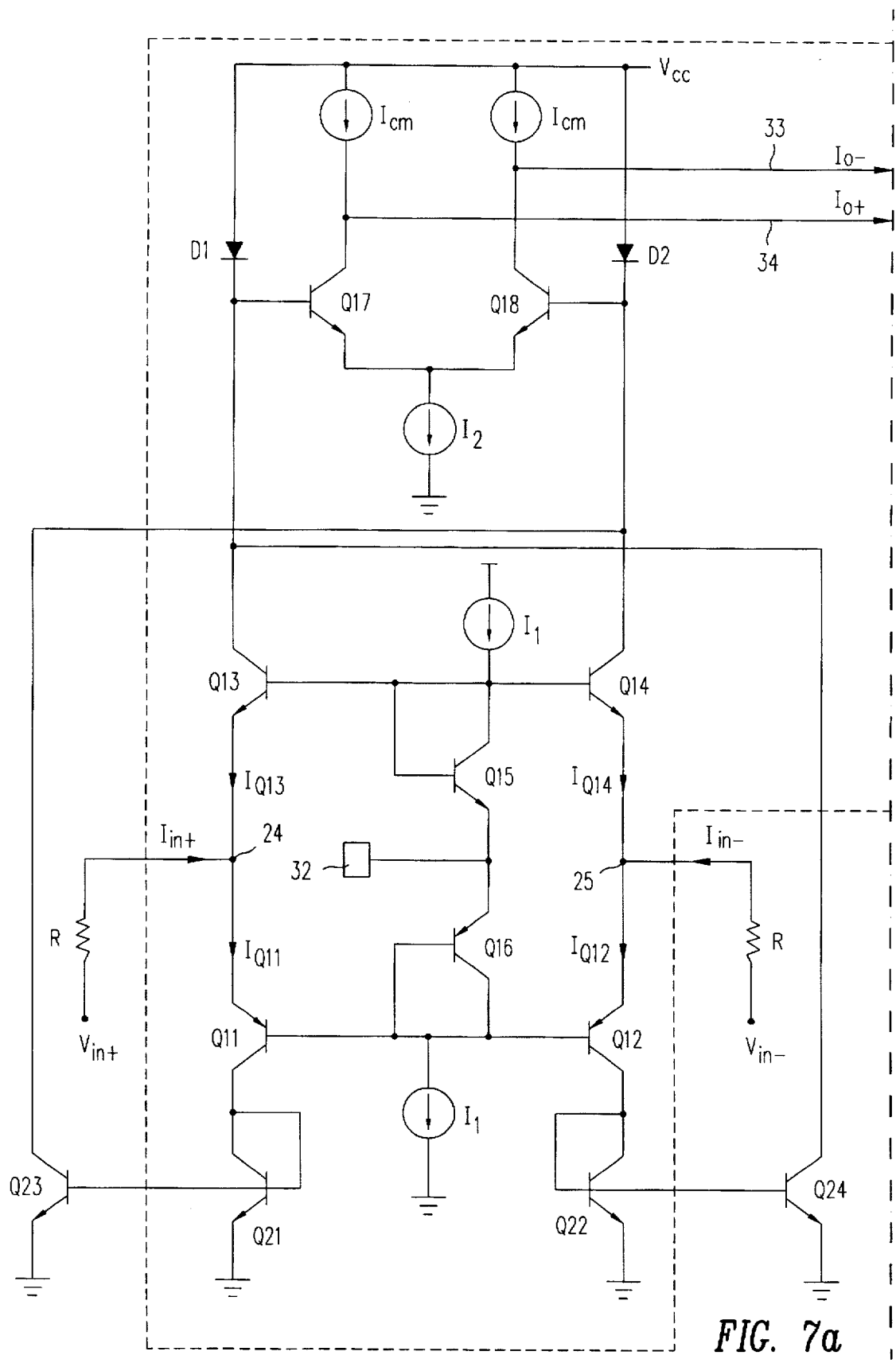
FIG. 7 is a schematic diagram of another embodiment of the integrator circuit of FIG. 5.

In another embodiment shown in FIG. 7, NPN transistors Q21 and Q22 and NPN transistors Q23 and Q24 may be connected in first and second feed-forward mirror configurations, respectively, to fold back the differential current developed in transistors Q11 and Q12 to the collectors of transistors Q14 and Q13, respectively. In this manner, the non-linear characteristics of currents $I_{Q13}$ and $I_{Q14}$ are effectively canceled by the non-linear characteristics of currents $I_{Q12}$ and $I_{Q11}$, respectively, thereby improving linearity and allowing for a larger input voltage swing.

Figure 8:
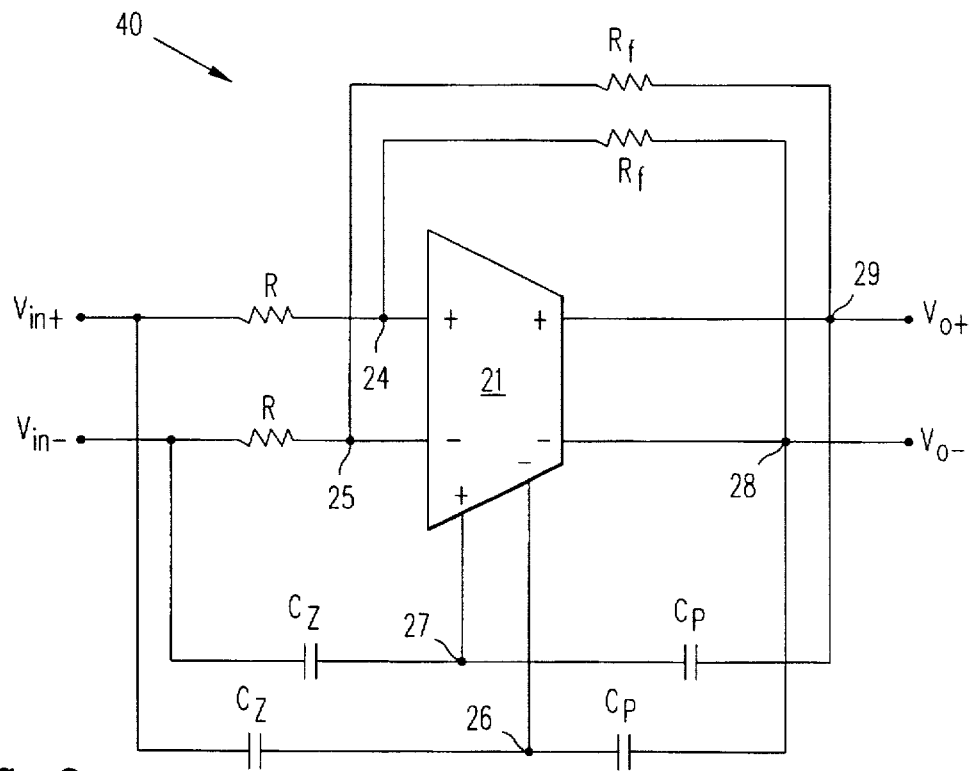
FIG. 8 is a block diagram illustrating the implementation of a first order pole-zero filter using integrators in accordance with the present invention.

Referring now to FIG. 8, the above-described transimpedance amplifier 21 may be employed in a filter 40 which in accordance with the present invention realizes a first order pole-zero transfer function $$T_4 = \frac{\Delta V_o}{\Delta V_{in}} = \frac{R_f}{R} \cdot \frac{\frac{R_{in}C_z}{\beta_R}s-1}{\frac{R_fC_p}{\beta_R}s+1} = A_{dc}\frac{s-\omega_z}{s-\omega_p},$$

where

-continued $$\omega_z = \frac{\beta_R}{RC_z}$$

$$\omega_p = \frac{\beta_R}{R_fC_p}$$

Figure 9:
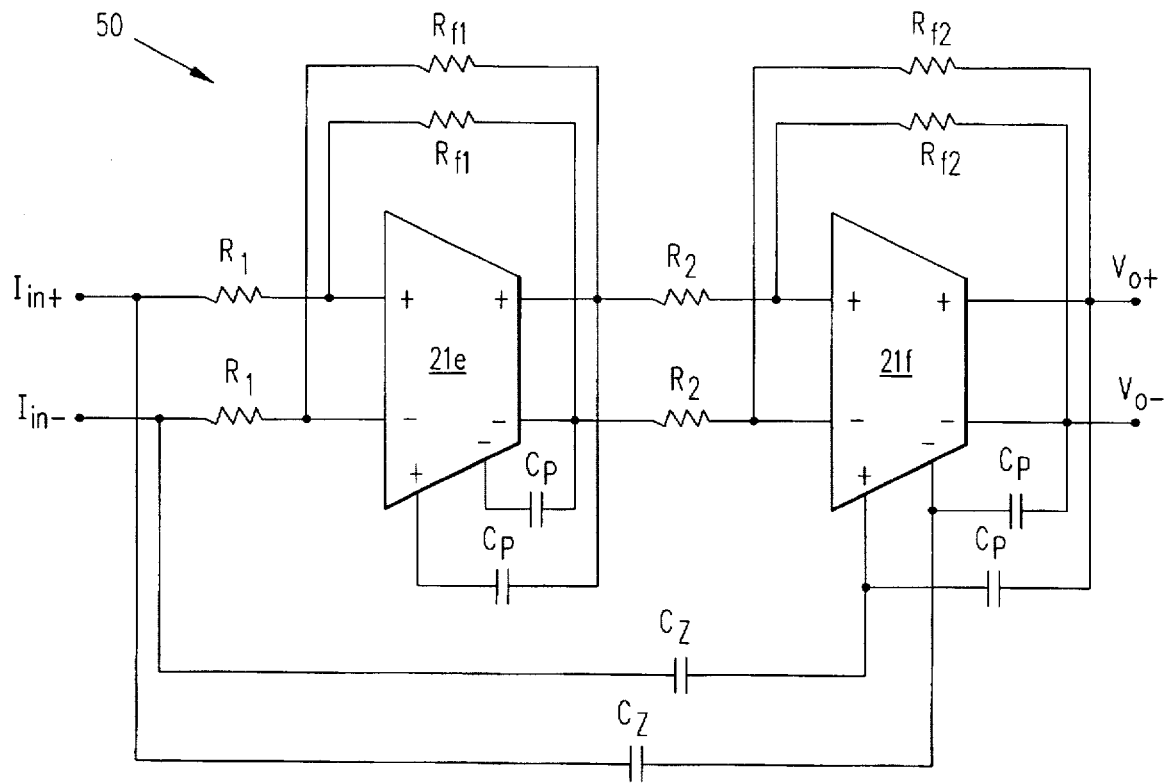
FIG. 9 is a block diagram illustrating the implementation of a second order filter using integrators in accordance with the present invention.

Two of amplifiers 21 may be employed in accordance $$A_{dc} = \frac{R_f}{R}.$$

with the present invention as shown in FIG. 9 to realize a second order filter 50 having a biquadratic pole-zero transfer function $T_5$, where $$T_5 = \frac{\Delta V_o}{\Delta V_{in}} = A_{dc}\frac{\frac{s^2}{\omega_z^2}+1}{\frac{s^2}{\omega_p^2}+\frac{s}{\omega_p}Q+1}$$

$$A_{dc} = \frac{R_{f1}}{R_1}$$

$$\omega_z = \frac{\beta_R}{\sqrt{C_zC_pR_1R_2}}$$

$$\omega_p = \frac{\beta_R}{C_p\sqrt{R_{f1}R_2}}$$

$$Q = \sqrt{\frac{R_{f2}}{R_{f1}} \cdot \frac{R_{f2}}{R_2}}$$

Constructing a filter capable of implementing a biquadratic transfer function, such as filter 50, using amplifiers 21 is advantageous. Since the value of Q is determined by a ratio of resistances, which can be matched with a tolerance of less than 1%, the value of Q may be established with great precision. The ability to accurately control the value of Q is important in high-order filters such as a CCIR 601 video filter since slight errors in Q may result in a significant degradation in the passband ripple.

Figure 3:
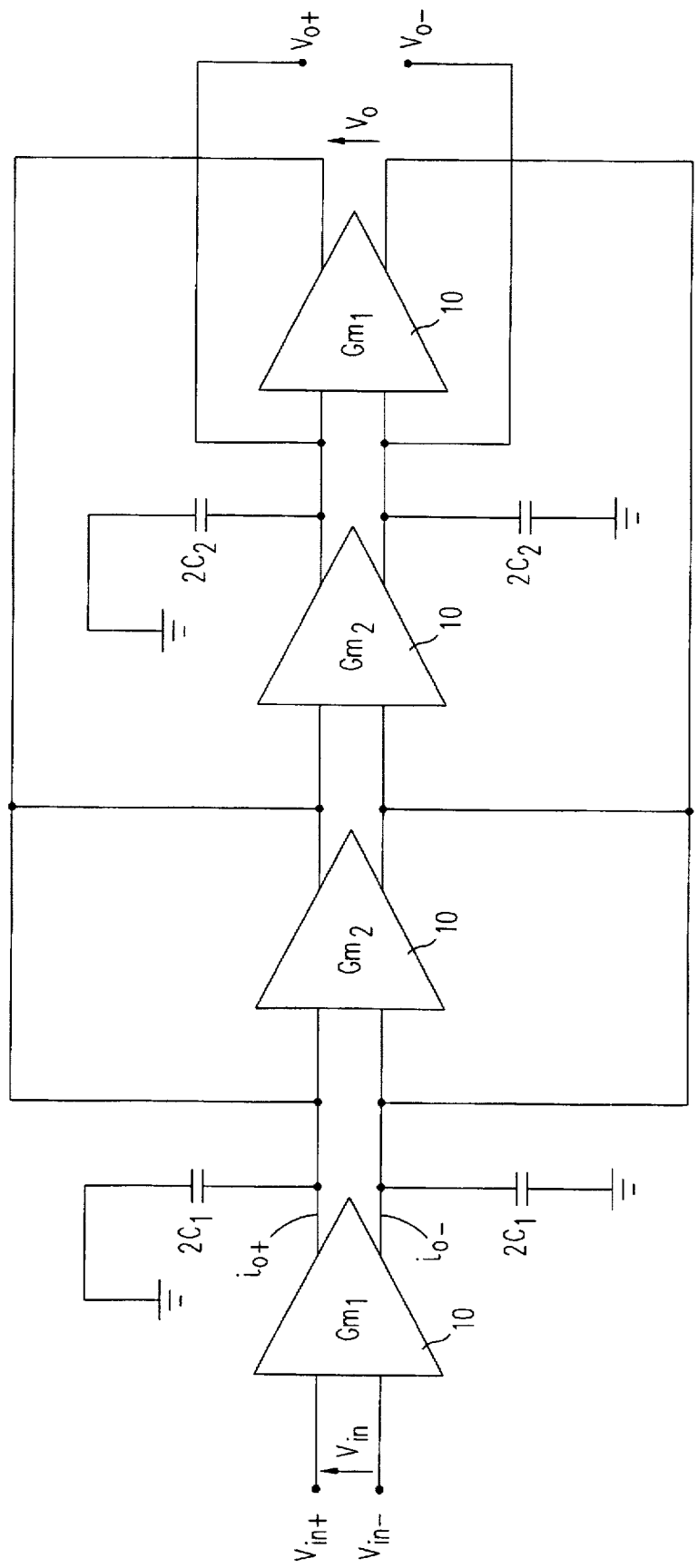
FIG. 3 is a block diagram of a second order filter implemented using conventional transconductor circuits.
Figure 4:
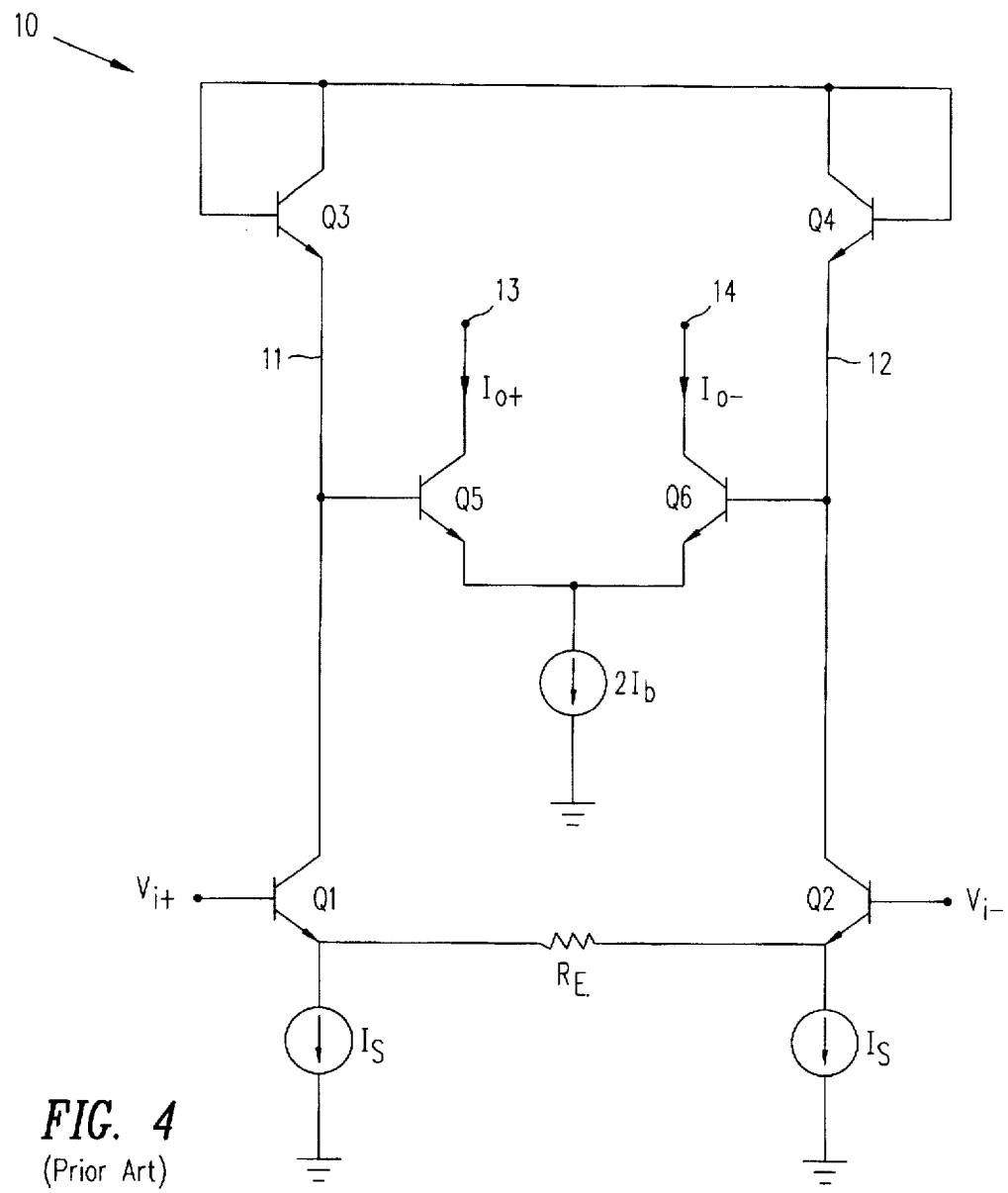
FIG. 4 is a schematic diagram of one of the conventional transconductor circuits of FIG. 3.

Referring again to FIG. 9, note that, in accordance with the present invention, biquadratic transfer functions may be implemented using only two of amplifiers 21. Note that implementing biquadratic filter functions in a conventional manner requires four of conventional transconductors 10 (see FIG. 3). This feature of filter 50 is advantageous since it is desirable, especially at high frequencies, to keep the number of filter stage to a minimum.

Figure 1:
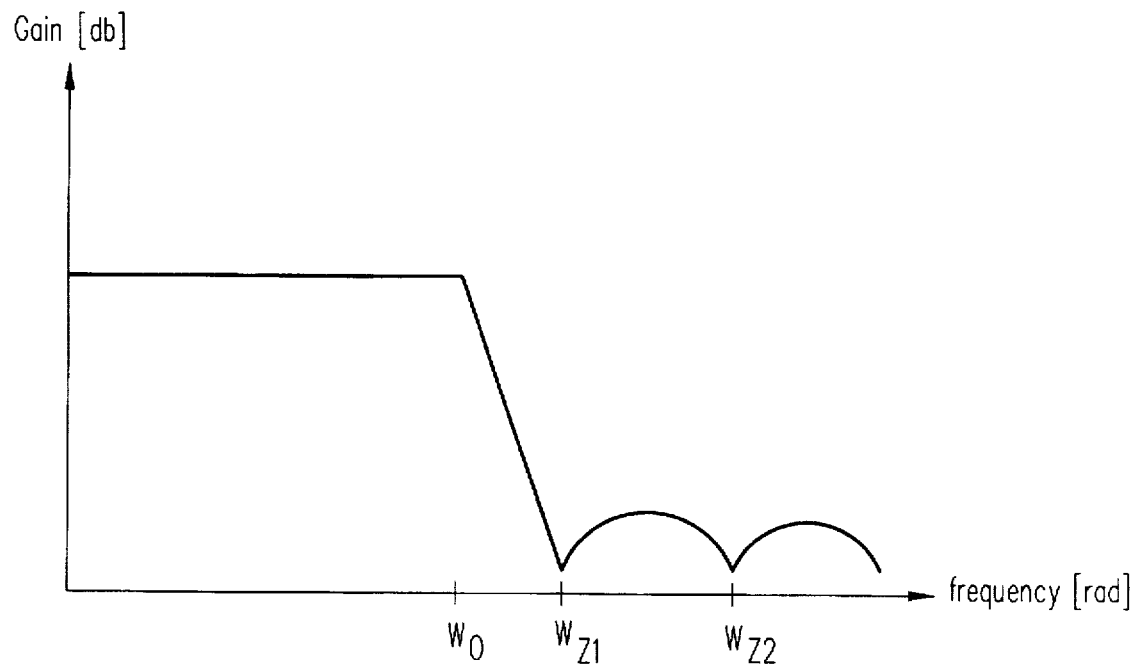
FIG. 1 illustrates the magnitude response of a conventional CCIR 601 video filter.
Figure 2:
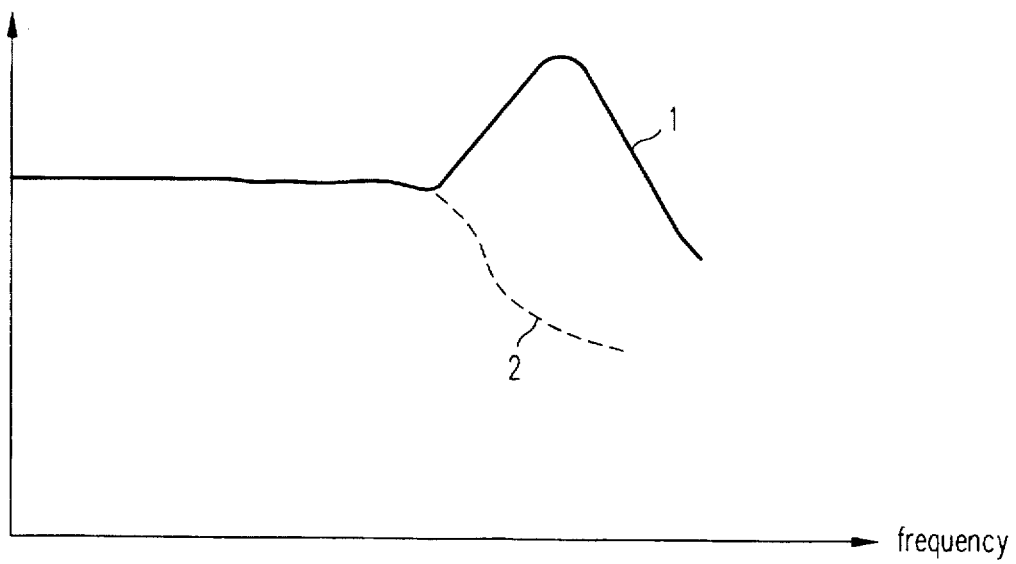
FIG. 2 illustrates the group delays of a 5th order elliptic filter and a 3rd order Bessel filter.

A CCIR 601 standards compliant video filter 60 may be implemented using just eight amplifiers 21, as illustrated in FIG. 6. Note that filters 50a and 50b, which are identical to filter 50 of FIG. 9, each include two of amplifiers 21. Filter 60 processes an incoming video signal $Y_{in}$ according to CCIR 601 standards which, as discussed above with respect to FIGS. 1 and 2, includes a 5th order elliptic filter function cascaded with a 3rd order Bessel filter function to generate an output video signal $Y_{out}$. Filter 60 thus realizes a transfer function $T_5 = Y_{out}/Y_{in} = T_1T_2T_6$, where filters 50a and 50b implement transfer functions $T_1$ and $T_2$, respectively, where $$T_1 = \frac{K_1(s^2+\omega_z^2)}{s^2+\frac{\omega_1}{Q_1}s+\omega_1^2}$$

-continued $$T_2 = \frac{K_2(s^2 + \omega_z^2)}{s^2 + \frac{\omega_2}{Q_2} s + \omega_2^2}$$

and amplifiers 21a, 21b, 21c and 21d collectively implement transfer function $T_6$, where $$T_6 = \frac{s^2 - \frac{\omega_A}{Q_A} s + \omega_A^2}{s^2 + \frac{\omega_A}{Q_A} s + \omega_A^2} \cdot \frac{(s - \omega_B)}{(s + \omega_B)} \cdot \frac{\omega_R}{(s + \omega_R)}$$

Figure 10:
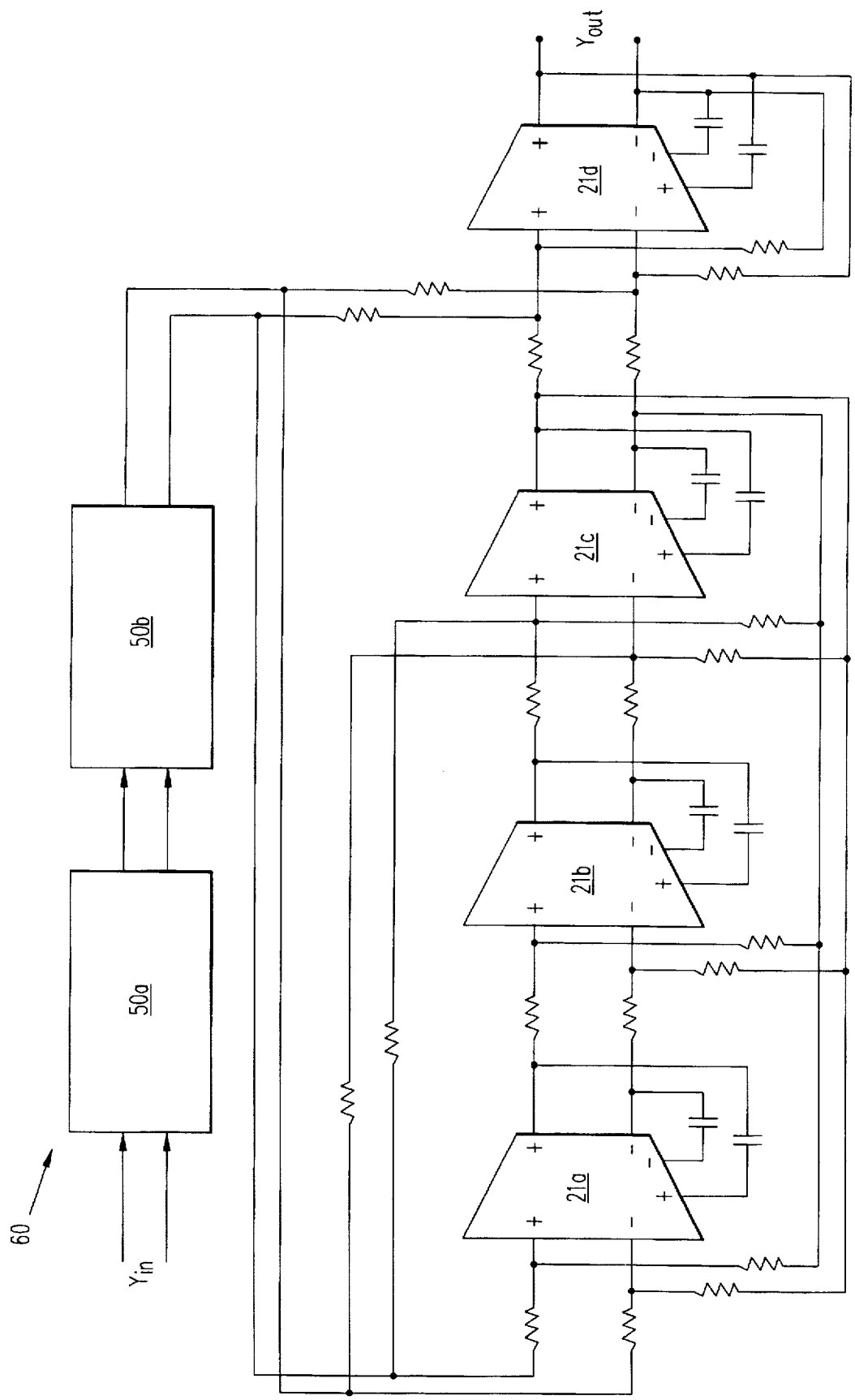
FIG. 10 is a block diagram of a CCIR 601 video filter in accordance with the present invention.

The poles, zeros, and time constants may be precisely controlled by selecting appropriate values for the resistors and capacitors shown in FIG. 10.

Since the architecture of filter 60 utilizes eight identical amplifiers 21, the only components that need to be matched are the various resistors and capacitors shown in FIG. 9. This not only simplifies the process of setting coefficient values for filter 60 but also increases precision. Further, controlling gain factor $\beta_R$ by varying current levels in amplifier 21 allows the frequency of filter 60 to be scaled without altering the nature of the magnitude response of filter 60. This feature enables filter 60 to have a wide programming range. It is to be noted that since filter 60 is fabricated using amplifiers 21, all of the advantages discussed above with respect to amplifier 21 are equally applicable to filter 60. Thus, the allowable wide input voltage signal of amplifier 21 allows filter 60, fabricated as a single integrated circuit, to process video signals in a manner compliant with CCIR 601 standards without pre-filter attenuation and post-filter amplification, thereby resulting a savings in circuit complexity, silicon real estate, and cost while providing a programming feature which allows filter 60, as well as other filters employing amplifier 21 based integrators, to be easily and precisely tailored for use in a variety of applications.

While particular embodiments of the present invention have been shown and described, it will be obvious to those skilled in the art that various changes and modifications may be made without departing from this invention in its broader aspects and, therefore, the appended claims encompass all such changes and modifications as fall within the true spirit and scope of this invention. Specifically, it is to be noted that the polarities of the transistors employed in the above-described embodiments may be reversed while still realizing the advantages discussed above. Further, the above-described embodiments may also be implemented in CMOS or BiCMOS technology.

What is claimed is:

1. A differential transimpedance amplifier comprising:
   first and second input terminals;
   a first transistor having an emitter coupled to said first input terminal, collector coupled to a first supply voltage, and a base;
   a second transistor having an emitter coupled to said second input terminal, a collector coupled to said first supply voltage, and a base coupled to said base of said first transistor;
   third transistor having an emitter coupled to said first input terminal, a collector coupled to a second supply voltage and a base;
   a fourth transistor having an emitter coupled to said second input terminal, a collector coupled to said second supply voltage and to said collector of said third transistor, and a base coupled to said base of said third transistor;
   first and second output terminals coupled to receive first and second signals provided by said collectors of said first and second transistors, respectively;
   a first current mirror having a first terminal coupled to said collector of said third transistor and a second terminal coupled to said collector of said second transistor; and
   a second current mirror having a first terminal coupled to said collector of said fourth transistor and a second terminal coupled to said collector of said first transistor,
   wherein said first mirror folds over a current flowing in the collector of said third transistor to said collector of said second transistor and said second mirror folds over a current flowing in said collector of said fourth transistor to said collector of said first transistor.

2. The differential transimpedance amplifier of claim 1 further comprising:
   a fifth transistor having a base coupled to said collector of said first transistor, a collector coupled to said first output terminal, and an emitter; and
   a sixth transistor having a base coupled to said collector of said second transistor, a collector coupled to said second output terminal, and an emitter coupled to said emitter of said fifth transistor, wherein said fifth and sixth transistors provide first and second currents to said first and second output terminals, respectively.

3. The differential transimpedance amplifier of claim 2 further comprising a bias circuit coupled between the common base of said first and second transistors and the common base of said third and fourth transistors.

4. The differential transimpedance amplifier of claim 3 wherein said bias circuit comprises:
   a first diode having an anode coupled to the common base of said first and second transistors and a cathode coupled to a common mode voltage; and
   a second diode having a cathode coupled to the common base of said third and fourth transistors and an anode coupled to said common mode voltage.

5. The differential transimpedance amplifier of claim 4 wherein said bias circuit further comprises:
   a first current source coupled between said first supply voltage and the common base of said first and second transistors; and
   a second current source coupled between the common base of said third and fourth transistors and said second supply voltage.

6. The differential transimpedance amplifier of claim 5 wherein said first and second diodes comprise diode-connected transistors.

7. The differential transimpedance amplifier of claim 5 wherein said first and second supply voltages comprise $V_{cc}$ and ground, respectively.

8. The differential transimpedance amplifier of claim 2 further comprising:
   a first resistor coupled between said first output terminal and said collector of said fifth transistor; and
   a second resistor coupled between said second output terminal and said collector of said sixth transistor.

9. The differential transimpedance amplifier of claim 2 further comprising:
   a third current source coupled between the common emitters of said fifth and sixth transistors and said second supply voltage;
   a fourth current source coupled between said first supply voltage and said collector of said fifth transistor; and
   a fifth current source coupled between said first supply voltage and said collector of said sixth transistor.

10. The differential transimpedance amplifier of claim 2 further comprising:
   a first diode coupled between said first supply voltage and said collector of said first transistor; and
   a second diode coupled between said first supply voltage and said collector of said second transistor.

11. A differential integrator comprising:
   first and second input terminals for receiving a differential input voltage;
   first and second voltage terminals for providing a differential output voltage;
   first and second resistors coupled to said respective first and second input terminals, said first and second resistors converting said differential input voltage into a differential input current;
   a transimpedance amplifier having first and second input terminals coupled to receive said differential input current, said transimpedance amplifier comprising:
      a first transistor having an emitter coupled to said first input terminal of said amplifier, a collector coupled to a first supply voltage, and a base;
      a second transistor having an emitter coupled to said second input terminal of said amplifier, a collector coupled to said first supply voltage, and a base coupled to said base of said first transistor;
      a third transistor having an emitter coupled to said first input terminal of said amplifier, a collector coupled to a second supply voltage, and a base;
      a fourth transistor having an emitter coupled to said second input terminal of said amplifier, a collector coupled to said second supply voltage and to said collector of said third transistor, and a base coupled to said base of said third transistor; and
      first and second output terminals coupled to receive first and second signals provided by said collectors of said first and second transistors, respectively,
   a first capacitor element coupled between said first voltage terminal and said first output terminal; and
   a second capacitor element coupled between said second voltage terminal and said second output terminal,
   wherein said first and second capacitors integrate a differential output current to generate said differential output voltage at said first and second voltage terminals.

12. The differential integrator of claim 11 further comprising:
   a first current mirror having a first terminal coupled to said collector of said third transistor and a second terminal coupled to said collector of said second transistor; and
   a second current mirror having a first terminal coupled to said collector of said fourth transistor and a second terminal coupled to said collector of said first transistor, wherein said first mirror folds over a current flowing in the collector of said third transistor to said collector of said second transistor and said second mirror folds over a current flowing in said collector of said fourth transistor to said collector of said first transistor.

13. The differential integrator of claim 12:
   a fifth transistor having a base coupled to said collector of said first transistor, a collector coupled to said first output terminal, and an emitter; and
   a sixth transistor having a base coupled to said collector of said second transistor, a collector coupled to said second output terminal, and an emitter coupled to said emitter of said fifth transistor.

14. A filter comprising:
   an input port for receiving a differential input voltage;
   a first resistive element coupled to said input port;
   a first differential transimpedance amplifier having an input port coupled to said first resistive element, an output current port, and a voltage port;
   a second resistive element coupled between said voltage port and said input port of said first transimpedance amplifier;
   a first capacitive element coupled between said output current port and said voltage port of said first transimpedance amplifier;
   a third resistive element coupled to said voltage port of said first transimpedance amplifier;
   a second differential transimpedance amplifier having an input port coupled to said third resistive element, an output current port, and a voltage port;
   a fourth resistive element coupled between said voltage port and said input port of said second transimpedance amplifier;
   a second capacitive element coupled between said voltage port and said output current port of said second transimpedance amplifier; and
   a third capacitive element coupled between said output current port of said second transimpedance amplifier and said input port of said filter, wherein said first and second differential transimpedance amplifiers each comprise:
      a first transistor having an emitter coupled to said input port of said amplifier, a collector coupled to a first supply voltage, and a base;
      a second transistor having an emitter coupled to said input port of said amplifier, a collector coupled to said first supply voltage, and a base coupled to said base of said first transistor;
      a third transistor having an emitter coupled to said input port of said amplifier, a collector coupled to a second supply voltage, and a base;
      a fourth transistor having an emitter coupled to said input port of said amplifier, a collector coupled to said second supply voltage and to said collector of said third transistor, and a base coupled to said base of said third transistor, wherein said output current port is coupled to receive first and second signals provided by said collectors of said first and second transistors, respectively.

15. The filter of claim 14 wherein each of said differential transimpedance amplifiers further comprise:
   a first current mirror having a first terminal coupled to said collector of said third transistor and a second terminal coupled to said collector of said second transistor; and
   a second current mirror having a first terminal coupled to said collector of said fourth transistor and a second terminal coupled to said collector of said first transistor, wherein said first mirror folds over a current flowing in the collector of said third transistor to said collector of said second transistor and said second mirror folds over a current flowing in said collector of said fourth transistor to said collector of said first transistor.

\* \* \* \* \*